United States Patent [19]
Baba et al.

[11] Patent Number: 5,895,226
[45] Date of Patent: Apr. 20, 1999

[54] METHOD OF MANUFACTURING SEMICONDUCTOR DEVICE

[75] Inventors: Koichi Baba, Ebina; Maiko Suzaki, Kawasaki, both of Japan

[73] Assignee: Kabushiki Kaisha Toshiba, Kawasaki, Japan

[21] Appl. No.: 08/979,782

[22] Filed: Nov. 26, 1997

[30] Foreign Application Priority Data

Nov. 26, 1996 [JP] Japan .................... 8-314712

[51] Int. Cl.⁶ .................................... H01L 21/00
[52] U.S. Cl. .................. 438/68; 438/460; 438/462
[58] Field of Search ................ 438/68, 460, 462

[56] References Cited

U.S. PATENT DOCUMENTS

| | | | |
|---|---|---|---|
| 4,874,920 | 10/1989 | Yamazaki et al. | 438/68 |
| 5,151,389 | 9/1992 | Zappella | 438/68 |
| 5,508,206 | 4/1996 | Glenn et al. | 438/68 |
| 5,633,196 | 5/1997 | Zamanian | 438/612 |

*Primary Examiner*—Kevin M. Picardat
*Assistant Examiner*—Deven Collins
*Attorney, Agent, or Firm*—Oblon, Spivak, McClelland, Maier & Neustadt, P.C.

[57] ABSTRACT

Two kinds of metal patterns 12, 13 are formed on a semiconductor wafer 11 to deposit a surface protective film 14 on the entirety of the surface to implement patterning to the surface protective film 14 so that the surface of the metal pattern 12 at least on dicing lines of the metal patterns 12, 13 is exposed to deposit barrier metal 15 on the entirety of the surface to remove, by etching, at the same time, portions on the dicing lines of the barrier metal 15 and the metal pattern 12 on the dicing lines of the metal patterns 12, 13 to carry out dicing with respect to the semiconductor wafer 11 along the dicing lines from which the metal pattern 12 has been removed to thereby prevent that the end portion of the metal pattern turned up by dicing comes into contact with inner lead or bonding wire so that any failure takes place.

10 Claims, 3 Drawing Sheets

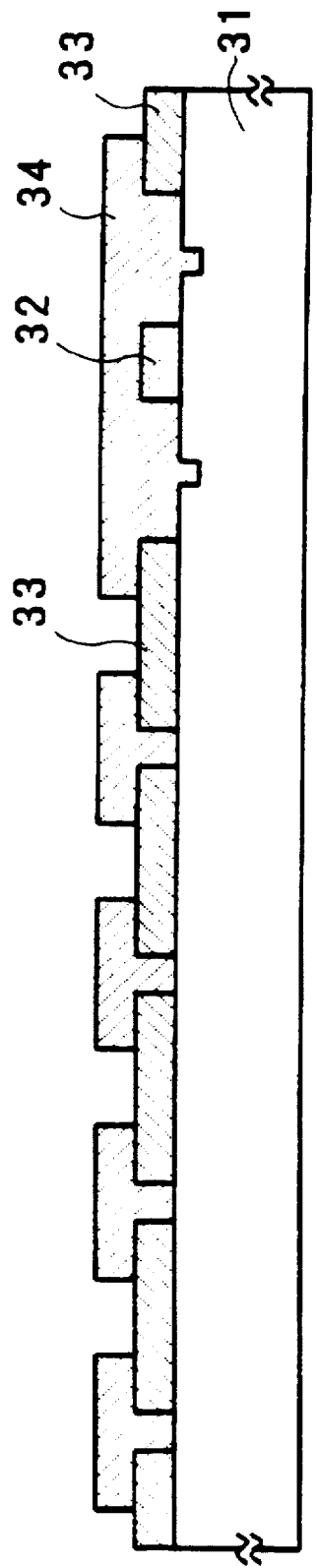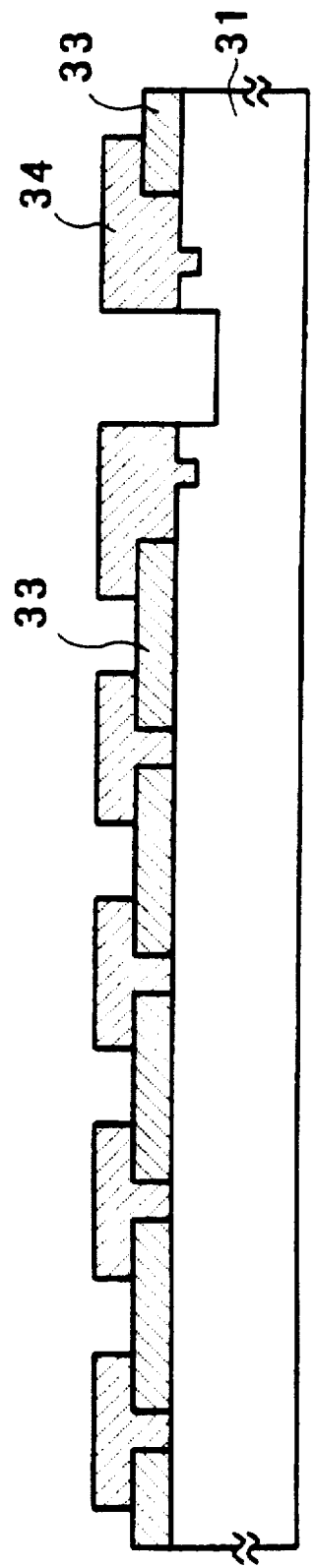

METHOD OF MANUFACTURING SEMICONDUCTOR DEVICE

BACKGROUND OF THE INVENTION

This invention relates to a method of manufacturing a semiconductor device, and more particularly to a processing implemented prior to dicing the semiconductor wafer.

In the case of dicing the semiconductor wafer, on the dicing lines, patterns indispensable for manufacturing such as mask alignment marks and/or quality control marks, etc. exist in respective layers. In general, such marks are formed by metal pattern or silicon oxide film, etc.

Hitherto, such an approach was employed to carry out dicing of the semiconductor wafer in the state where marks comprised of metal pattern are left on the semiconductor wafer to quarry semiconductor chips to carry out packaging. However, when dicing is carried out, the end portion of the metal pattern constituting the mark is turned up. As a result, in carrying out TAB (Tape Automated Bonding) packaging or wire bonding packaging, problems as described below have arisen.

In the TAB packaging, the inner lead and the metal pattern turned up at the edge portion of the semiconductor chip are caused to be in contact with each other. As a result, short circuit takes place between terminals adjacent through the metal pattern. In addition, the metal pattern which has been caused to be in contact with the substrate such as device characteristic monitor pattern, etc. existing at the edge portion of the semiconductor chip comes into contact with the inner lead. As a result, the p-type semiconductor substrate short-circuits with the ground terminal and the n-type semiconductor substrate short-circuit with the power supply terminal.

In the wire bonding packaging, the bonding wire and the metal pattern of the edge portion of the semiconductor chip are caused to be in contact with each other. As a result, short circuit takes place between terminals adjacent through the metal pattern. In addition, the metal pattern which has been in contact with the substrate at the edge portion of the semiconductor chip comes into contact with the bonding wire. As a result, the p-type semiconductor substrate short-circuits with the ground terminal and the n-type semiconductor substrate short-circuits with the power supply terminal.

As described above, hitherto, there was the problem that the metal pattern turned up at the time of dicing gives rise to inconveniences in the electric characteristic.

SUMMARY OF THE INVENTION

Accordingly, an object of this invention is to provide a method of manufacturing a semiconductor device, which can prevent occurrence of electrical inconveniences by the metal pattern existing on the dicing lines.

A method of manufacturing a semiconductor device of this invention comprises: a step of forming metal pattern on the surface of a semiconductor wafer; and a step of removing, prior to carrying out dicing, pattern portions positioned on dicing lines of the metal pattern.

As stated above, prior to carrying out dicing with respect to the semiconductor wafer, metal pattern (pattern portions) on the dicing lines is removed to thereby prevent that the metal pattern turned up by dicing comes into contact with the inner lead or the bonding wire so that any inconvenience is caused to take place, thus making it possible to improve the reliability.

Moreover, a manufacturing method of this invention comprises: a step of depositing a metal layer on the surface of a semiconductor wafer; a step of forming at least pads and metal pattern, by using the photo-lithographic process and etching, with respect to the metal layer; a step of depositing a surface protective film on the entirety of the surface; a step of implementing patterning to the surface protective film to open surface portions of the pads to allow all surfaces of pattern portions existing on dicing lines of the metal pattern to be exposed; a step of depositing a barrier metal layer on the entirety of the surface; a step of forming a resist film in which only regions where bump is to be formed on the pads are opened to carry out plating using the resist film as mask to form the bumps on the regions where the bump is to be formed; a step of removing the barrier metal layer of regions except for the regions where the bump is to be formed with the bumps being as mask to thereby remove portions of the barrier metal layer on the dicing lines; and a step of carrying out dicing the semiconductor wafer along the dicing lines from which the metal pattern portions have been removed.

Further, a manufacturing method of this invention comprises: a step of forming metal pattern on the surface of a semiconductor wafer; a step of depositing a surface protective film on the entirety of the surface to implement patterning to the surface protective film so that at least surfaces of portions on dicing lines of the metal pattern are exposed; a step of depositing barrier metal on the entirety of the surface to remove, by etching, at the same time, at least portions on the dicing lines of the barrier metal and portions on the dicing lines of the metal pattern; and a step of carrying out dicing the semiconductor wafer along the dicing lines from which the metal pattern portions have been removed.

Further, a manufacturing method of this invention comprises: a step of forming metal pattern and a surface protective film thereafter to coat resist on the entirety of the surface without depositing barrier metal to form a resist film so as to remove regions on dicing lines and to cover other portions; and a step of removing, by etching, portions of the metal pattern on the dicing lines with the resist film being as mask.

In addition, a manufacturing method of this invention comprises: a step of forming metal pattern thereafter to deposit a surface protective film on the entirety of the surface to carry out patterning so that a predetermined pattern can be obtained within regions except for dicing lines; and a step of irradiating laser beams to remove at least portions of the surface protective film and portions of the metal pattern on the dicing lines.

In this case, the metal pattern may consist of any one of aluminum, copper, mixture of aluminum, silicon and copper, and mixture of aluminum and copper; and the surface protective film may consist of any one of phospho-silicate glass; silicon oxide; silicon nitride; polyimide; phospho-silicate glass and silicon nitride; phospho-silicate glass and polyimide; phospho-silicate glass, silicon nitride and polyimide; silicon oxide and silicon nitride; silicon oxide and polyimide; and silicon oxide, silicon nitride and polyimide.

BRIEF DESCRIPTION OF THE DRAWINGS

In the accompanying drawings:

FIG. 3 is a longitudinal cross sectional view of device showing, every respective process steps, a method of manufacturing a semiconductor device according to a third embodiment of the present invention.

DESCRIPTION OF THE PREFERRED EMBODIMENTS

Respective preferred embodiments of this invention will now be described with reference to the attached drawings.

Procedure of a method of manufacturing a semiconductor device according to the first embodiment is shown, every respective process steps, in FIG. 1. The method according to the first embodiment is used when TAB packaging is carried out.

Figure 1A:
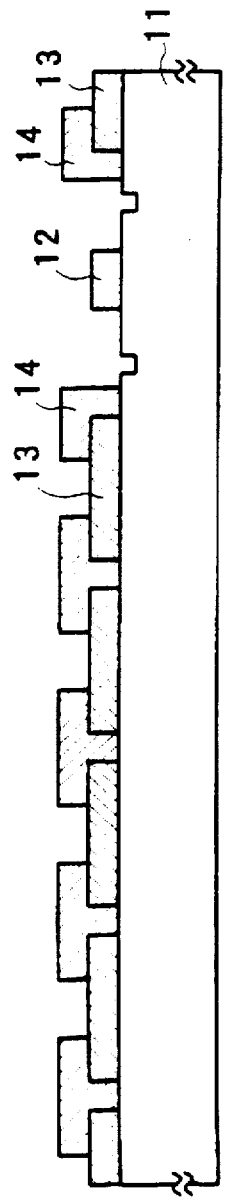
FIG. 1 is a longitudinal cross sectional view of device showing, every respective process steps, a method of manufacturing a semiconductor device according to a first embodiment of the present invention.

In FIG. 1(a), a metal layer consisting of Al-Si-Cu is deposited on the surface of a semiconductor wafer 11 by sputtering process so that the film thickness becomes equal to about 10000 angstroms. Then, patterning is carried out by using the photo-lithographic process and the etching technology to form, at the same time, pads 13 for bonding and a metal pattern 12 for mask alignment, quality control and device characteristic monitor, etc. The metal pattern 12 is positioned on dicing lines. Phospho-silicate glass (PSG) is deposited by CVD process on the entirety of the surface as a surface protective film so that its film thickness becomes equal to 4000 angstroms. This PSG film 14 is caused to undergo patterning to open the surface portions of the bonding pads 13. At this time, all surfaces of the metal pattern 12 on the dicing lines are exposed at the same time.

Figure 1B:
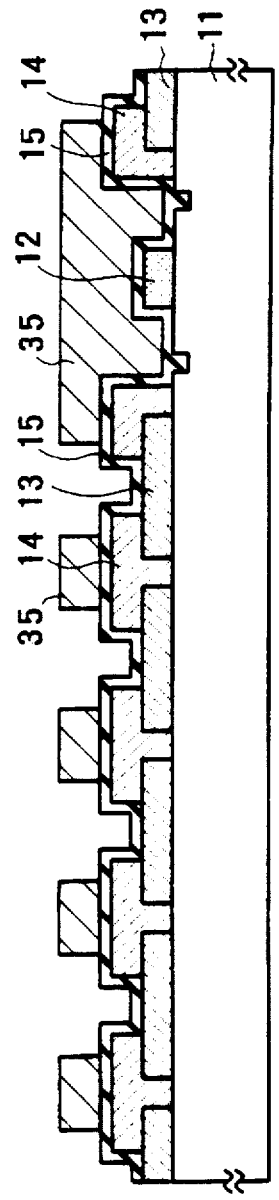

Then, as shown in FIG. 1(b), a barrier metal layer 15 consisting of Ti-Ni-Pd in which Ti compatible with Al is caused to be lower layer and Pd compatible with Au is caused to be upper layer in order to enhance bonding strength with respect to Au bump for TAB which will be described later is deposited by sputtering process on the entirety of the surface to form a resist film 35 in which only the portions where Au bump is to be formed are opened. With respect to the film thickness of the barrier metal layer, e.g., Ti is 1000 angstroms, Ni is 3000 angstroms and Pd is 500 angstroms.

Figure 1C:
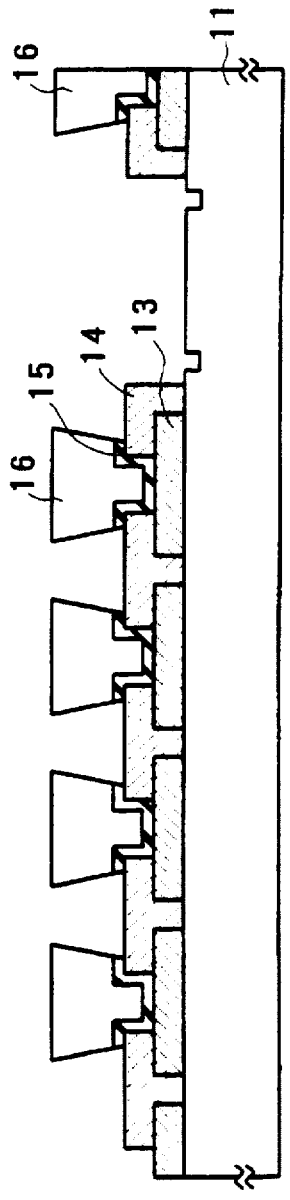

As shown in FIG. 1(c), Au bumps 16 are formed by plating on the surface of the barrier metal layer 15 on the pads 13 for bonding to separate (peel off) the resist film 35. With the Au bumps 16 being as mask, unnecessary portions where the Au bumps 16 are not formed of the barrier metal layer 15 are removed by reactive ion etching (RIE) using chlorine system gas and metal pattern 12 on the dicing lines is removed at the same time. Thereafter, dicing is carried out with respect to the semiconductor wafer 11 along the dicing lines to split it into plural semiconductor chips.

A method of manufacturing a semiconductor device according to a second embodiment of this invention will now be described with reference to FIG. 2. This embodiment relates to the method used in the case where packaging is carried out by using wire bonding.

Figure 2A:
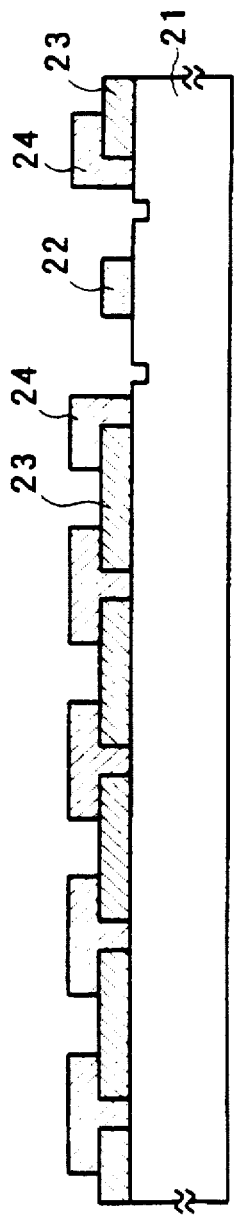
FIG. 2 is a longitudinal cross sectional view of device showing, every respective process steps, a method of manufacturing a semiconductor device according to a second embodiment of the present invention.

As shown in FIG. 2(a), metal layer consisting of Al-Si-Cu is deposited on the surface of a semiconductor wafer 21 by sputtering process so that its film thickness becomes equal to about 10000 angstroms. Then, patterning is implemented to the metal layer in a manner similar to the first embodiment to form, at the same time, pads 23 for bonding and metal pattern 22 for mask alignment, quality control and device characteristic monitor, etc.

Then, PSG is deposited on the entirety of the surface by the CVD process so that its film thickness becomes equal to 4000 angstroms to implement patterning to PSG film 24 to open surface portions of the pads 23 for bonding. At the same time, all the surface of the metal pattern 22 on the dicing lines are exposed.

Figure 2B:
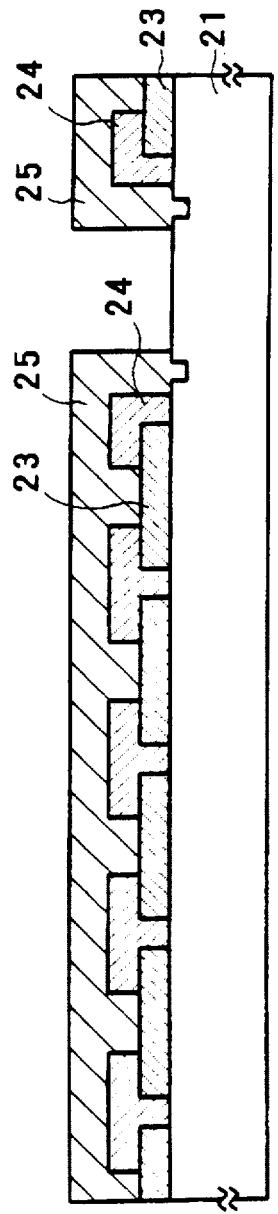
Figure 2C:
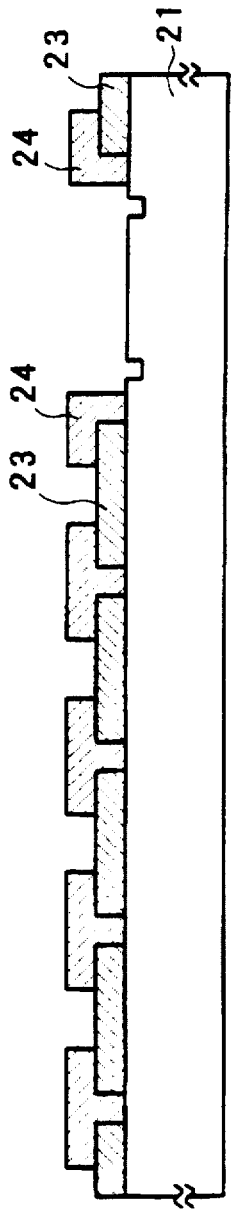

As shown in FIG. 2(b), resist is coated on the entirety of the surface to form a resist film 25 in which regions of the dicing lines are removed and other portions are covered. By using this resist film 25 as mask, the metal pattern 22 on the dicing lines is removed by etching. Then, the resist film 25 which covers the portions except for the regions of the dicing lines is separated (peeled off) as shown in FIG. 2(c). Thereafter, dicing is carried out along the dicing lines to split the semiconductor wafer into plural semiconductor chips to respectively carry out wire bonding works.

In the above-described both first and second embodiments, the metal pattern on the dicing lines are remover by etching. On the contrary, as in the case of the third embodiment, metal pattern as described above may be mechanically removed.

As shown in FIG. 3(a), a metal layer consisting of Al-Si-Cu is deposited on the surface of a semiconductor wafer 31 by sputtering process so that its film thickness becomes equal to about 10000 angstroms. Then, patterning is implemented to the metal layer to form, at the same time, pads 33 for bonding and metal pattern 32 for mask alignment, quality control and device characteristic monitor, etc.

Then, PSG is deposited on the entirety of the surface by the CVD process so that its film thickness becomes equal to 4000 angstroms to implement patterning to the PSG film 34 to open the surface portions of the pads 33 for bonding. Unlike the second embodiment, at this stage, the surface of the metal pattern 32 on the dicing line is covered by the PSG film 34 in the state where it is not exposed.

Then, as shown in FIG. 3(b), laser beams are irradiated to remove the PSG film 34, the metal pattern 32 and the surface portion of the semiconductor wafer 31 on each dicing line. Thereafter, dicing is carried out to split the semiconductor wafer into semiconductor chips to carry out wire bonding with respect to the pads 33 for bonding.

In accordance with the first to third embodiments, since the metal pattern on the dicing lines is removed prior to dicing, there is no possibility that the metal pattern turned up by dicing may come into contact with the inner lead of the TAB package or bonding wire in the wire bonding package. Thus, inconveniences in the electric characteristic can be prevented.

It should be noted that the above-described embodiments are presented only for illustrative purpose, and therefore do not limit this invention in any sense. For example, as the metal pattern, in addition to Al-Si-Cu, there may be used Al, Cu, Al-Cu alloy or high melting point metal such as Ti, W, TiN, etc.

Further, as the surface protective film, in addition to PSG, there may be used silicon oxide; plasma SiN; polyimide; phospho-silicate glass and silicon nitride; phospho-silicate glass and polyimide; phospho-silicate glass, silicon nitride and polyimide; silicon oxide and silicon nitride, silicon oxide and polyimide; and silicon oxide, silicon nitride and polyimide, etc. As the barrier metal, in addition to Ti-Ni-Pd, there may be used Cu-Cr, Au-Pd-Ti, Ti-W-Pt, Au-Pt-Ti, etc. In this case, it is desirable to select material compatible with both the film of the lower portion and the film of the upper portion which are directly in contact therewith.

As bump, in addition to Au, there may be used SnPb, Cu, Au-Cu, Au-Ni, etc.

What is claimed is:

1. A method of manufacturing a semiconductor device comprising:

a step of forming a metal pattern on a surface of a semiconductor wafer; and a step of removing, prior to carrying out dicing, pattern portions positioned on dicing lines of the metal pattern.

2. A method of manufacturing a semiconductor device as set forth in claim 1, wherein the metal pattern consists of any one of aluminum, copper, mixture of aluminum, silicon and copper, and mixture of aluminum and copper; and a surface protective film consists of any one of: phospho-silicate glass; silicon oxide; silicon nitride; polyimide; phospho-silicate glass and silicon nitride; phospho-silicate glass and polyimide; phospho-silicate glass, silicon nitride and polyimide; silicon oxide and silicon nitride; silicon oxide and polyimide; and silicon oxide, silicon nitride and polyimide.

3. A method of manufacturing a semiconductor device comprising:

a step of forming a metal pattern on a surface of a semiconductor wafer;

a step of depositing a surface protective film on an entirety of the surface to implement patterning to the surface protective film so that surfaces of portions at least on dicing lines of the metal pattern are exposed;

a step of depositing a barrier metal on the entirety of the surface to remove, by etching, at the same time, at least portions on the dicing lines of the barrier metal and the portions on the dicing lines of the metal pattern prior to carrying out dicing; and a step of carrying out dicing the semiconductor wafer along the dicing lines from which the metal pattern portions have been removed.

4. A method of manufacturing a semiconductor device as set forth in claim 3, wherein the metal pattern consists of any one of aluminum, copper, mixture of aluminum, silicon and copper, and mixture of aluminum and copper; and the surface protective film consists of any one of: phospho-silicate glass; silicon oxide; silicon nitride; polyimide; phospho-silicate glass and silicon nitride; phospho-silicate glass and polyimide; phospho-silicate glass, silicon nitride and polyimide; silicon oxide and silicon nitride; silicon oxide and polyimide; and silicon oxide, silicon nitride and polyimide.

5. A method of manufacturing a semiconductor device comprising:

a step of depositing a metal layer on a surface of a semiconductor wafer;

a step of forming at least pads and a metal pattern, using a photo-lithographic process and etching, by patterning the metal layer;

a step of depositing a surface protective film on an entirety of the surface;

a step of implementing patterning to the surface protective film to open surface portions of pads to allow all surfaces of pattern portions existing on dicing lines of the metal layer to be exposed;

a step of depositing a barrier metal layer on the entirety of the surface;

a step of forming a resist film in which only regions where a bump is to be formed on the pads are opened to carry out plating using the resist film as a mask to form the bumps on the regions where the bump is to be formed;

a step of removing the barrier metal layer of regions except for the regions where the bump is to be formed using the bumps as a mask to thereby remove portions of the barrier metal layer on the dicing lines prior to carrying out dicing; and a step of carrying out dicing the semiconductor wafer along the dicing lines from which the metal pattern portions have been removed.

6. A method of manufacturing a semiconductor device as set forth in claim 5, wherein the metal pattern consists of any one of aluminum, copper, mixture of aluminum, silicon and copper, and mixture of aluminum and copper; and the surface protective film consists of any one of: phospho-silicate glass; silicon oxide; silicon nitride; polyimide; phospho-silicate glass and silicon nitride; phospho-silicate glass and polyimide; phospho-silicate glass, silicon nitride and polyimide; silicon oxide and silicon nitride; silicon oxide and polyimide; and silicon oxide, silicon nitride and polyimide.

7. A method of manufacturing a semiconductor device comprising:

a step of forming A metal pattern on a surface of a semiconductor wafer;

a step of depositing a surface protective film on an entirety of the surface to implement patterning to the surface protective film so that surfaces of portions at least on dicing lines of the metal pattern are exposed;

a step of coating resist on the entirety of the surface and forming a resist film where regions on the dicing lines are removed;

a step of removing, by etching, the metal pattern portions on the dicing lines using the resist film as a mask prior to carrying out dicing; and a step of carrying out dicing the semiconductor wafer along the dicing lines from which the metal pattern portions have been removed.

8. A method of manufacturing a semiconductor device as set forth in claim 7, wherein the metal pattern consists of any one of aluminum, copper, mixture of aluminum, silicon and copper, and mixture of aluminum and copper; and the surface protective film consists of any one of: phospho-silicate glass; silicon oxide; silicon nitride; polyimide; phospho-silicate glass and silicon nitride; phospho-silicate glass and polyimide; phospho-silicate glass, silicon nitride and polyimide; silicon oxide and silicon nitride; silicon oxide and polyimide; and silicon oxide, silicon nitride and polyimide.

9. A method of manufacturing a semiconductor device comprising:

a step of forming a metal pattern on a surface of a semiconductor wafer;

a step of depositing a surface protective film on an entirety of the surface and carrying out patterning so that patterns including circuit patterns can be obtained in regions except for dicing lines;

a step of irradiating laser beams to remove portions of the surface protective film and portions of the metal pattern on the dicing lines prior to carrying out dicing; and a step of carrying out dicing the semiconductor wafer along the dicing lines from which the metal pattern portions have been removed.

10. A method of manufacturing a semiconductor device as set forth in claim 9.

wherein the metal pattern consists of any one of: aluminum; copper; mixture of aluminum, silicon and copper; and mixture of aluminum and copper; and the surface protective film consists of any one of: phospho-silicate glass; silicon oxide; silicon nitride; polyimide; phospho-silicate glass and silicon nitride; phospho-silicate glass and polyimide; phospho-silicate glass, silicon nitride and polyimide; silicon oxide and silicon nitride; silicon oxide and polyimide; and silicon oxide, silicon nitride and polyimide.

* * * * *